(12) United States Patent
Zhu et al.

(10) Patent No.: US 8,211,557 B2
(45) Date of Patent: Jul. 3, 2012

(54) BINARY ANISOTROPY MEDIA

(75) Inventors: Jian-Gang Zhu, Pittsburgh, PA (US);
David E. Laughlin, Pittsburgh, PA (US)

(73) Assignee: Carnegie Mellon University, Pittsburgh, PA (US)

( * ) Notice: Subject to any disclaimer, the term of this patent is extended or adjusted under 35 U.S.C. 154(b) by 337 days.

(21) Appl. No.: 11/700,308

(22) Filed: Jan. 31, 2007

(65) Prior Publication Data

US 2008/0180827 A1 Jul. 31, 2008

(51) Int. Cl.
*G11B 5/66* (2006.01)
(52) U.S. Cl. ....... 428/828.1; 360/59; 360/135; 427/128; 369/13.1
(58) Field of Classification Search .............. 428/810, 428/811–816, 826, 828; 360/59
See application file for complete search history.

(56) References Cited

U.S. PATENT DOCUMENTS

| | | | |
|---|---|---|---|
| 6,391,483 B1 | 5/2002 | Zhu et al. | |
| 6,498,747 B1 | 12/2002 | Gogl et al. | |
| 6,686,070 B1 * | 2/2004 | Futamoto et al. | 428/827 |
| 6,791,871 B2 | 9/2004 | Freitag et al. | |
| 6,808,783 B1 * | 10/2004 | Lin et al. | 428/832 |
| 6,834,026 B2 | 12/2004 | Fullerton et al. | |
| 6,956,257 B2 | 10/2005 | Zhu et al. | |
| 7,313,043 B2 | 12/2007 | Gogl et al. | |
| 2003/0017364 A1 * | 1/2003 | Kikitsu et al. | 428/693 |
| 2003/0104247 A1 * | 6/2003 | Girt | 428/693 |
| 2004/0094785 A1 | 5/2004 | Zhu et al. | |
| 2004/0207962 A1 * | 10/2004 | Saito et al. | 360/324.11 |
| 2005/0084715 A1 * | 4/2005 | Hee et al. | 428/694 TM |
| 2005/0281081 A1 | 12/2005 | Fullerton et al. | |

OTHER PUBLICATIONS

X. Zhu et al., "Spin Torque and Field-Driven Perpendicular MRAM Designs Scalable to Multi-Gb/Chip Capacity," IEEE Trans. on Magnetics, vol. 42, No. 10, Oct. 2006, pp. 2739-2741.
R. Ditizio et al., "Cell Shape and Patterning Considerations for Magnetic Random Access Memory (MRAM) Fabrication," Semiconductor Manufacturing Magazine, Jan. 2004.
J. Zhu, "New heights for hard disk drives," Materials Today, Jul./Aug. 2003.
Inoue et al., "Magnetic Properties of Single-Crystalline FeRH Alloy Thin Films", IEEE Transactions on Magnetics, vol. 44, No. 11, Nov. 2008, 4 pages.

* cited by examiner

*Primary Examiner* — Holly Rickman
*Assistant Examiner* — Linda Chau
(74) *Attorney, Agent, or Firm* — K&L Gates LLP

(57) ABSTRACT

A magnetic microstructure comprising (i) a magnetic storage layer having a magnetic easy axis perpendicular to a film plane of the storage magnetic layer; (ii) a magnetic assist layer having a magnetic easy axis in the film plane; and (iii) a phase transition interlayer between the magnetic storage layer and the magnetic assist layer. The phase transition layer comprises a material, such as FeRh, that switches from antiferromagnetic at ambient to ferromagnetic at a transition temperature that is greater than ambient, but below the Curie temperature. When the phase transition interlayer is in antiferromagnetic phase, there exists little magnetic coupling between the storage and assist layers. When the interlayer changes to ferromagnetic phase, the interlayer couples the magnetic moments of the storage and assist layer ferromagnetically. If the anisotropy field-thickness product of the two layers is similar and the coupling is sufficiently strong, the effective magnetic anisotropy of the storage layer and the assist layer essentially vanishes. That way, the required write field at the recording temperature needs only to be a few percent of the ambient anisotropy field of the storage layer.

46 Claims, 12 Drawing Sheets

(a) (Below Transition Temp.)

(b) (Above Transition Temp.)

(c) (Switching of Storage Layer due to Magnetic Field H)

| (a) | (b) | (c) |
|---|---|---|
| (Below Transition Temp.) | (Above Transition Temp.) | (Switching of Storage Layer due to Magnetic Field H) |

BINARY ANISOTROPY MEDIA

BACKGROUND

In conventional hard disk drives, the area density capability is limited by the inability to generate sufficient magnetic field so that the anisotropy field of each magnetic grain in a disk medium is artificially constrained. Such constraints limit the minimal size of magnetic grains in the media, hence limiting the area density that can be reached with sufficient magnetic thermal stability of the disk media and sufficient signal-to-medium-noise ratio.

An alternative approach is to use heat to assist the recording process. At an elevated temperature, the field required to reverse the magnetic moment orientation in the storage layer of the media becomes significantly smaller than that at ambient. This scheme is known as heat assisted magnetic recording, i.e., HAMR.

However, current HAMR technology utilizes a Curie point writing mechanism in which the write temperature exceeds the Curie temperature of the media. When the medium cools down to below Curie temperature, magnetization re-occurs in the presence of a recording field and the recording of a data bit is accomplished. The Curie temperature writing scheme requires the recording media to be heated to a relatively high temperature that could cause medium structural variation. Further, the re-occurrence of the uniform magnetization appears to be relatively slow and also requires rapid heat dissipation perpendicular to the film to prevent lateral expansion of the thermal energy.

U.S. Pat. No. 6,834,026 to Fullerton discloses a magnetic recording medium for thermally-assisted recording that comprises a bilayer of a high-coercivity, high-anisotropy ferromagnetic material and a switching material, like FeRh, that exhibits a switch from antiferromagnetic to ferromagnetic at a transition temperature less than the Currie temperature of the high-coercivity, high-anisotropy ferromagnetic material.

SUMMARY

In one general aspect, the present invention is directed to a magnetic microstructure, sometimes referred to below as "binary anisotropy media" (or "BAM"), that enables robust data recording at a temperature significantly below the Curie temperature, but still above the ambient temperature. According to various embodiments, the magnetic microstructure comprises (i) a magnetic storage layer having a magnetic easy axis perpendicular to the film plane; (ii) a magnetic assist layer having a magnetic easy axis in the film plane; and (iii) a phase transition interlayer between the magnetic storage layer and the magnetic assist layer. The phase transition layer comprises a material, such as FeRh, that switches from antiferromagnetic at ambient to ferromagnetic at a transition temperature that is greater than ambient, but below the Curie temperature of the phase transition interlayer (and preferably below the Curie temperatures of the perpendicular and in-plane magnetic layers). When the phase transition interlayer is in the antiferromagnetic phase (or non-magnetic phase), there exists little magnetic coupling between the storage and assist layers. When the interlayer changes to the ferromagnetic phase (i.e., when it is heated to or above the transition temperature), the interlayer couples the magnetic moments of the storage and assist layers ferromagnetically. As a result, in contrast to prior art magnetic recording media such as disclosed in the Fullerton patent mentioned above, if the anisotropy field-thickness product of the two layers is similar and the coupling is sufficiently strong, the effective magnetic anisotropy of the storage layer and the assist layer essentially vanishes. That way, the required write field at the recording temperature (a temperature at or above the transition temperature) needs only to be a few percent of the ambient anisotropy field of the storage layer. This enables, in various embodiments, recording to occur in the deep sub-nanosecond regime and with much less heating energy than that used in Curie temperature writing. Further, the transition temperature can be tuned by the addition of other elements, such as Ir, so that the anisotropy switching occurs at a desired temperature.

In other general aspects, the present invention is directed to magnetic recording media including the binary anisotropy media layer as well as a magnetic memory cell including the binary anisotropy media layer.

FIGURES

Various embodiments of the present invention are described herein by way of example in conjunction with the following figures wherein.

Figure 7:
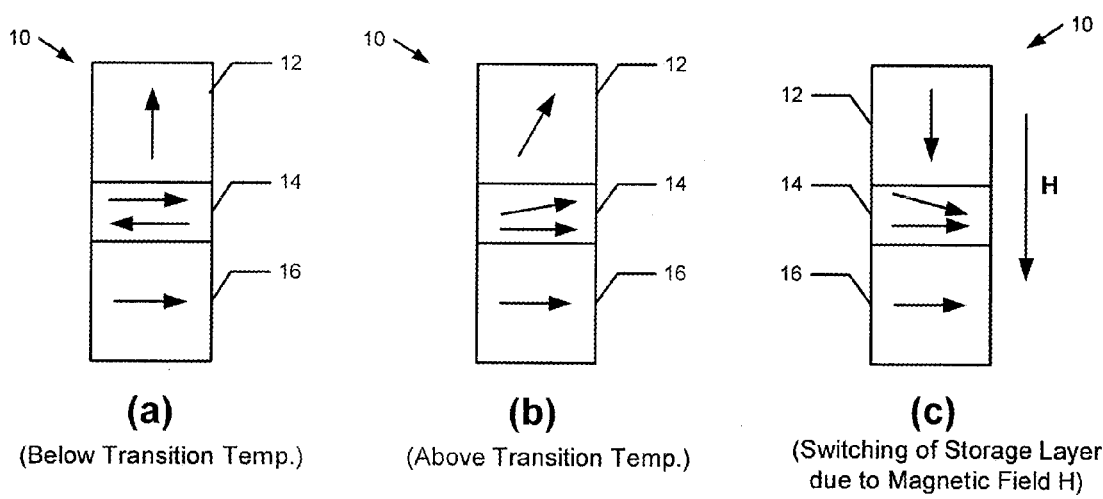
Figure 9:
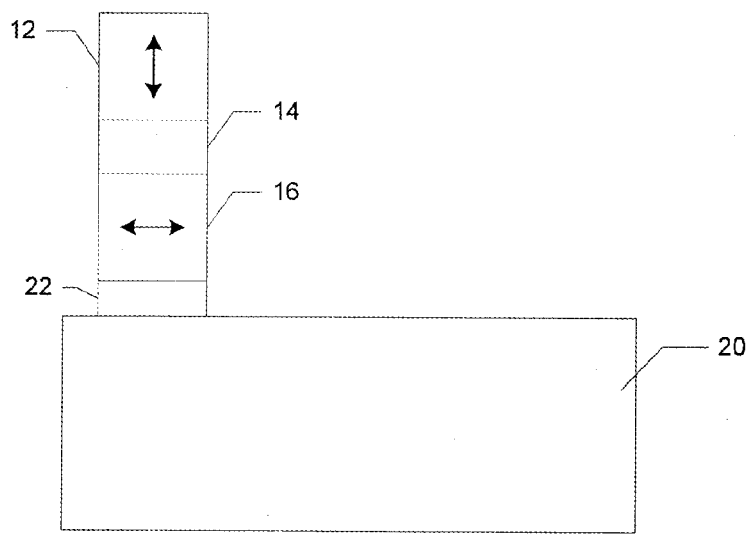
Figure 10:
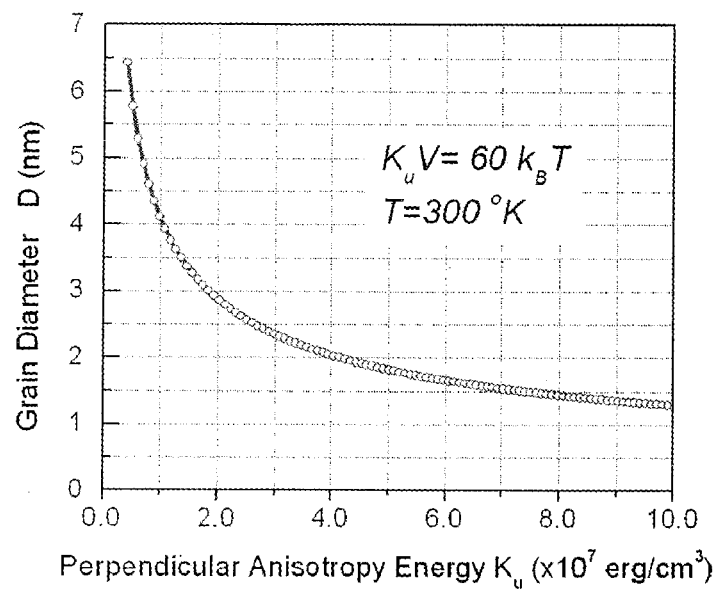
Figure 11:
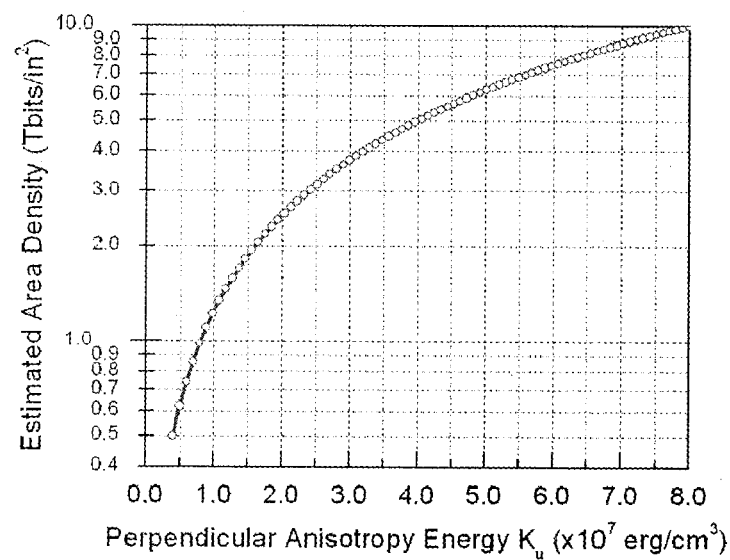
Figure 12:
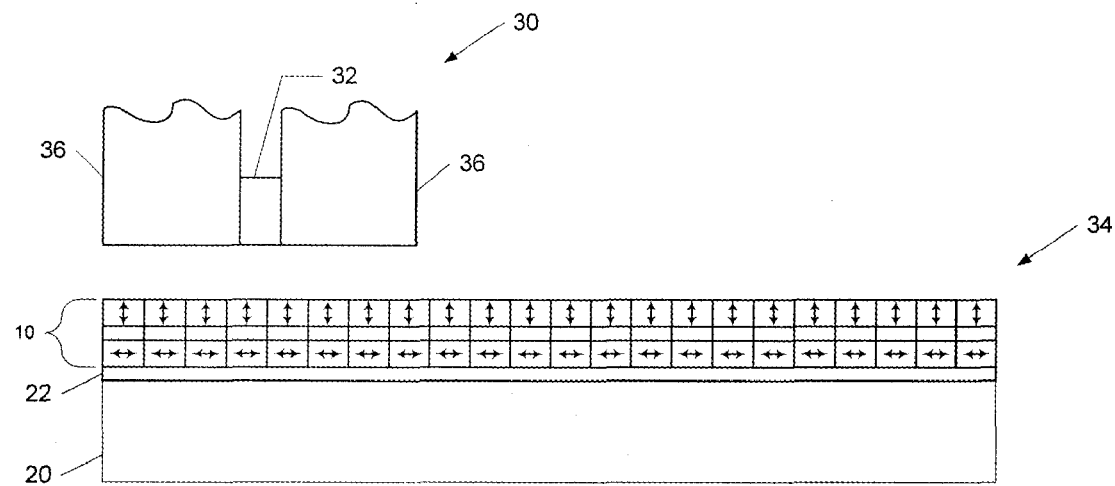
Figure 13:
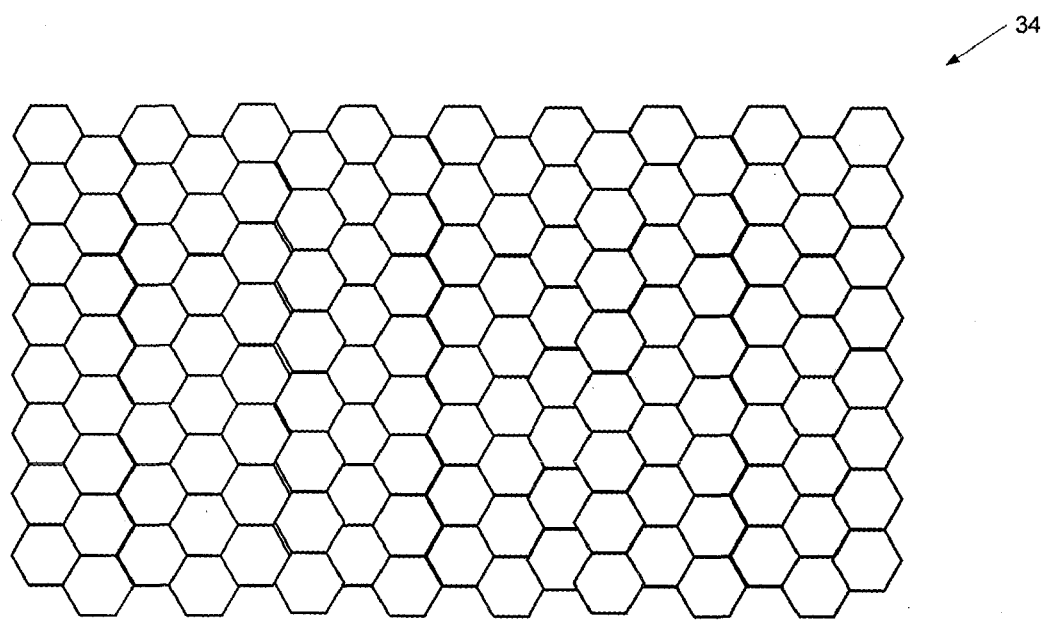
Figure 15:
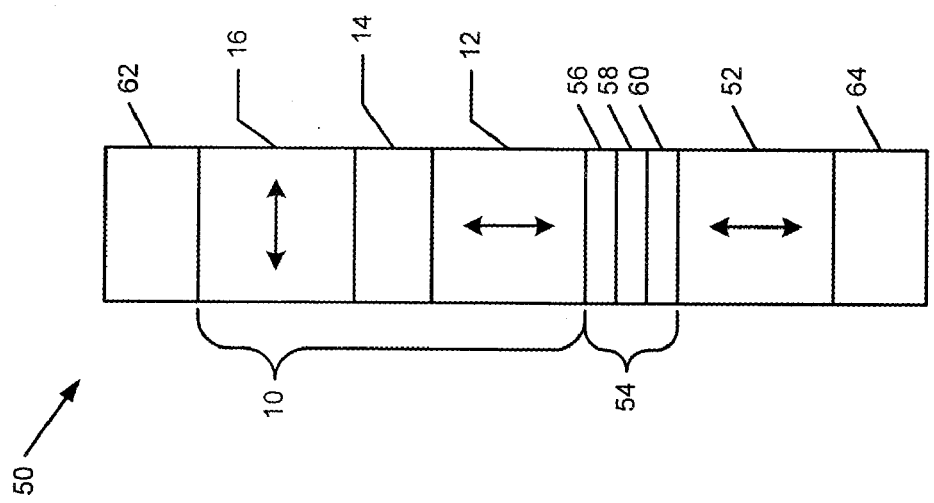
Figure 14:
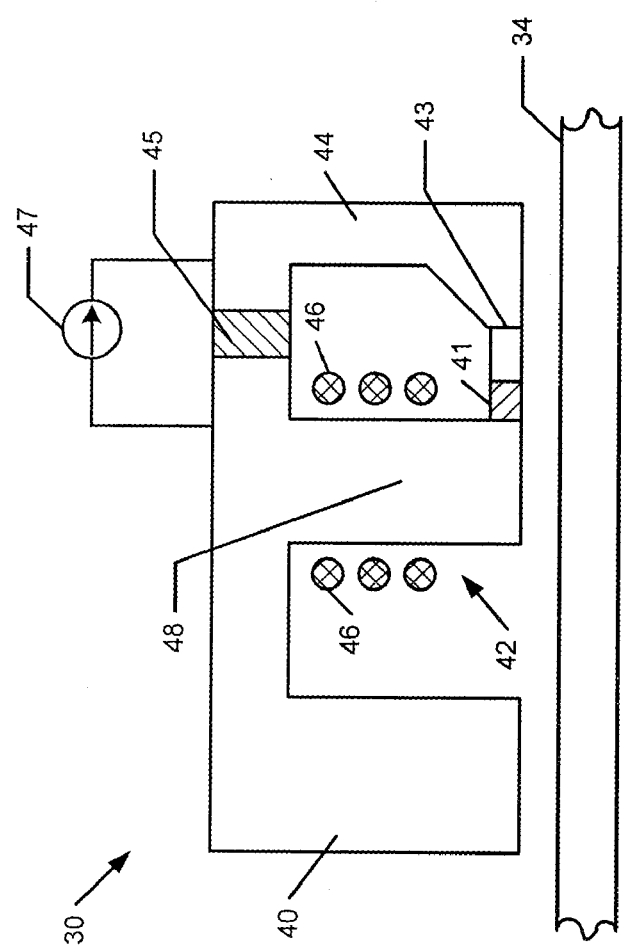
Figure 16:
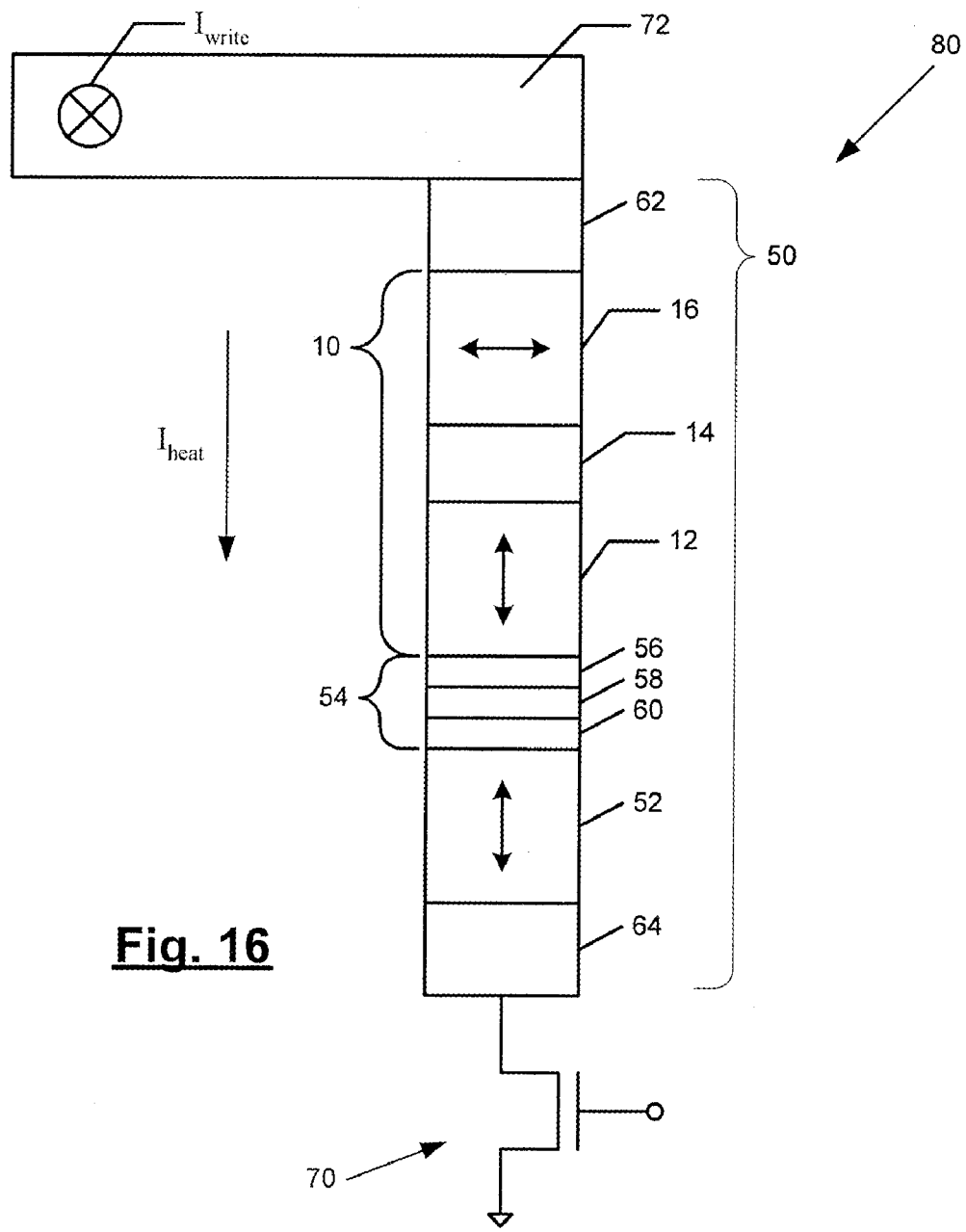
Figure 17:
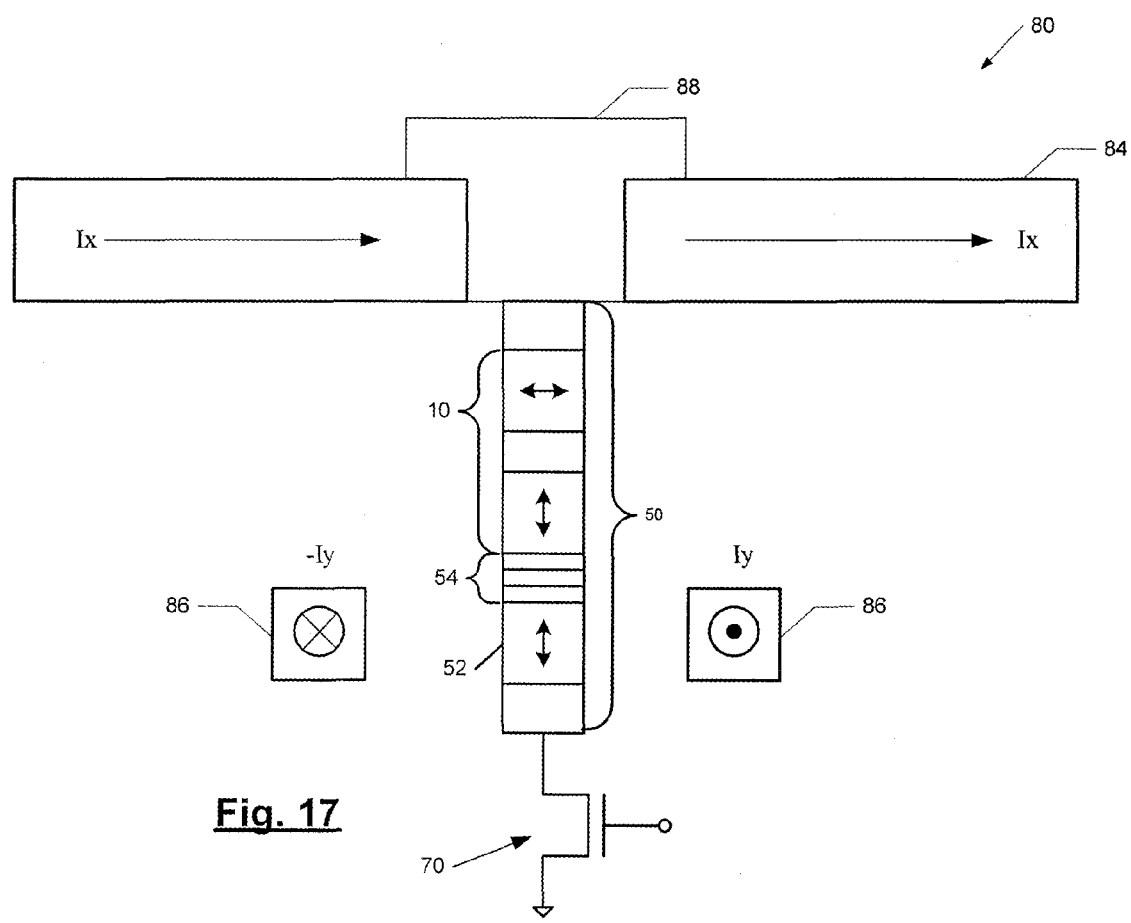
Figure 18:
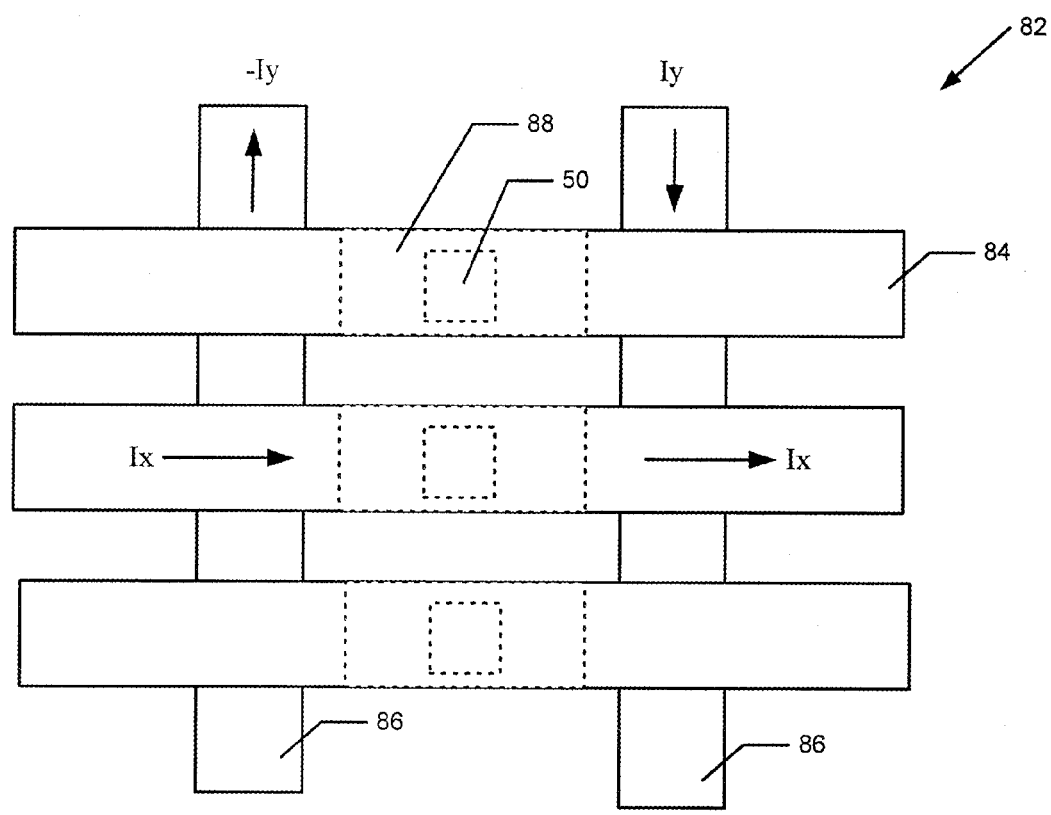
Figure 19:
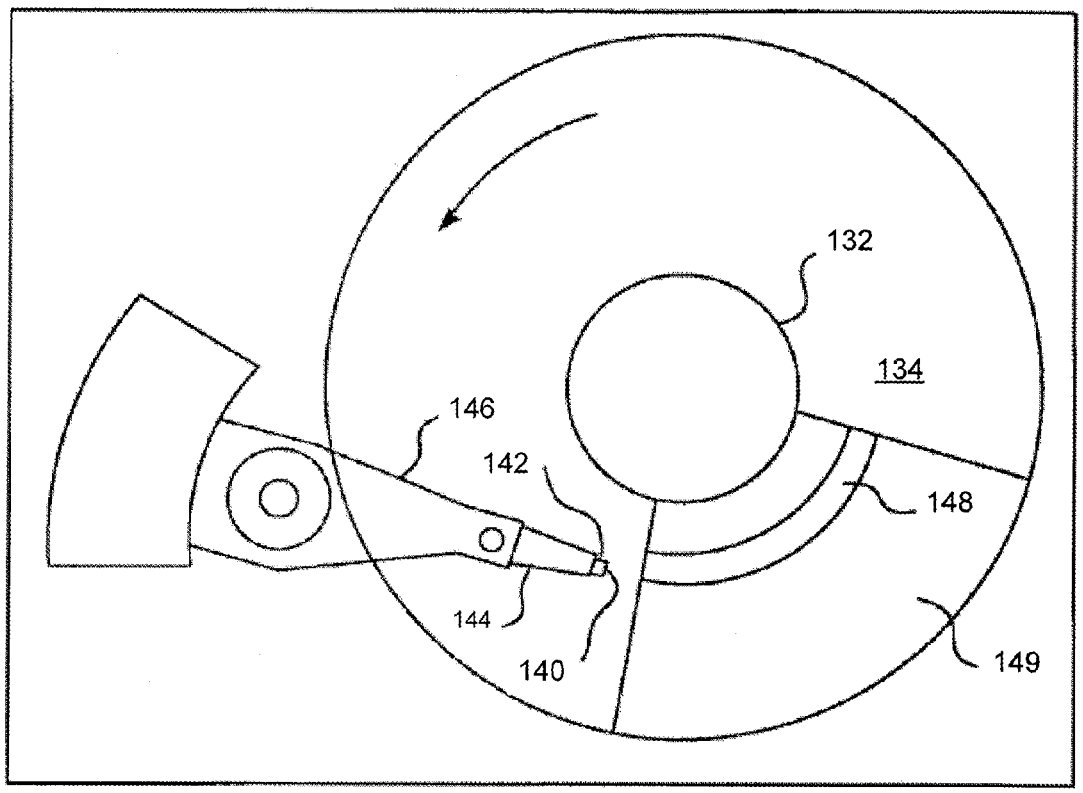
Figure 20:
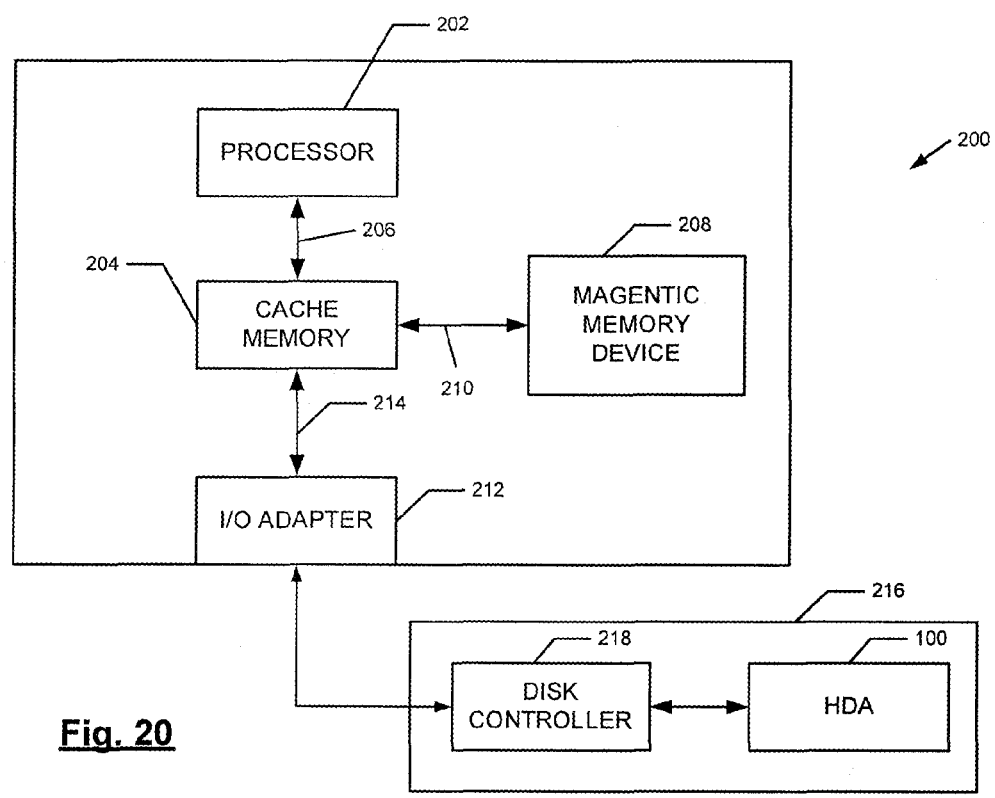

FIGS. 7(a)-(c) illustrate the binary anisotropy media at various temperature levels according to various embodiments of the present invention;

FIG. 8 is a diagram of the binary anisotropy media according to another embodiment of the present invention;

FIG. 9 is a diagram of the binary anisotropy media deposited on top of a soft magnetic underlayer (SUL) according to various embodiments of the present invention;

FIG. 10 is a chart showing the calculated grain diameter as a function of the crystalline anisotropy energy constant of the grains in the storage layer of the binary anisotropy media according to various embodiments of the present invention;

FIG. 11 is a chart showing the calculated area density capability using the binary anisotropy media according to various embodiments of the present invention;

FIGS. 12 and 14 are diagrams of write head for writing data to a magnetic recording medium including the binary anisotropy media according to various embodiments of the present invention;

FIG. 13 is a top plan view of a magnetic recording medium including the binary anisotropy media according to various embodiments of the present invention;

FIG. 15 is a diagram of a magnetic memory element according to various embodiments of the present invention;

FIGS. 16 and 17 are diagrams of memory cells according to various embodiments of the present invention;

FIG. 18 is a diagram of an array of memory cells according to various embodiments of the present invention;

FIG. 19 is a diagram of head disk assembly according to various embodiments of the present invention; and FIG. 20 is a diagram of a computing device according to various embodiments of the present invention.

DETAILED DESCRIPTION

Figure 1:
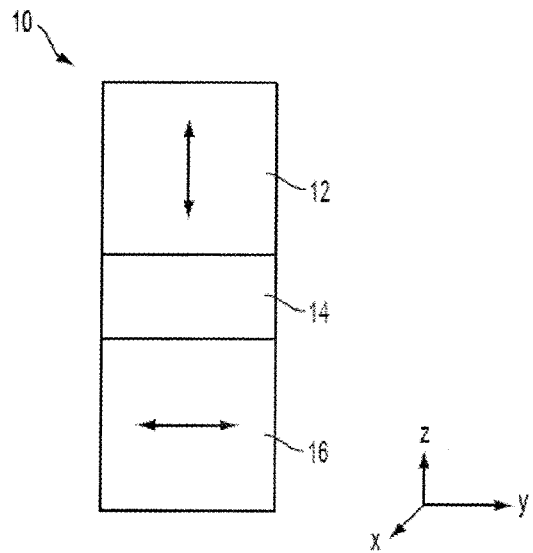
FIGS. 1 and 2 are diagrams of the binary anisotropy media according to various embodiments of the present invention.
Figure 2:
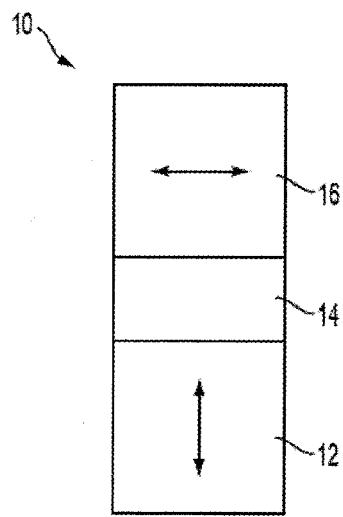

FIG. 1 is a side view of a magnetic microstructure 10, or binary anisotropy media (BAM), according to various embodiments of the present invention. The binary anisotropy media 10 may be used to store binary data such as in a magnetic recording medium or in a magnetic memory unit (e.g., a magnetic random access memory (MRAM) unit), as described further below. As shown in FIG. 1, the BAM 10 may comprise a magnetic storage layer 12, a phase transition interlayer 14, and a magnetic assist layer 16. The phase transition layer 14 is between the storage layer 12 and the assist layer 16. In FIG. 1, the storage layer 12 is above the assist layer 16. In the example of FIG. 2, the storage layer 12 is below the assist layer 16.

The magnetic storage layer 12 may comprise small magnetic grains, each with a strong uniaxial magnetic anisotropy and a magnetic easy axis perpendicular to the film plane. With reference to the Cartesian coordinates shown in FIG. 1, the magnetic easy axis (indicated by the vertical arrow in magnetic storage layer 10 in FIG. 1) may be in the z-direction and the film plane is in the x-y plane in this example. The magnetic assist layer 16 may also comprise small magnetic grains, each grain having a strong uniaxial magnetic anisotropy and a magnetic easy axis in the film plane (i.e., in the x-direction in the example) as indicated by the horizontal arrow in the magnetic assist layer 16 in FIG. 1. The magnetic layers 12, 16 may comprise magnetic materials such as, for example, Co alloys, FePt ($L1_0$), CoPt, FePd, AlMn, or other $L1_0$ materials. The thickness of the storage layer 12 and assist layer 16 may vary depending on the materials used. For instance, the storage layer 12 and the assist layer 16 may each have thicknesses of between 5 nm and 20 nm.

Figure 3:
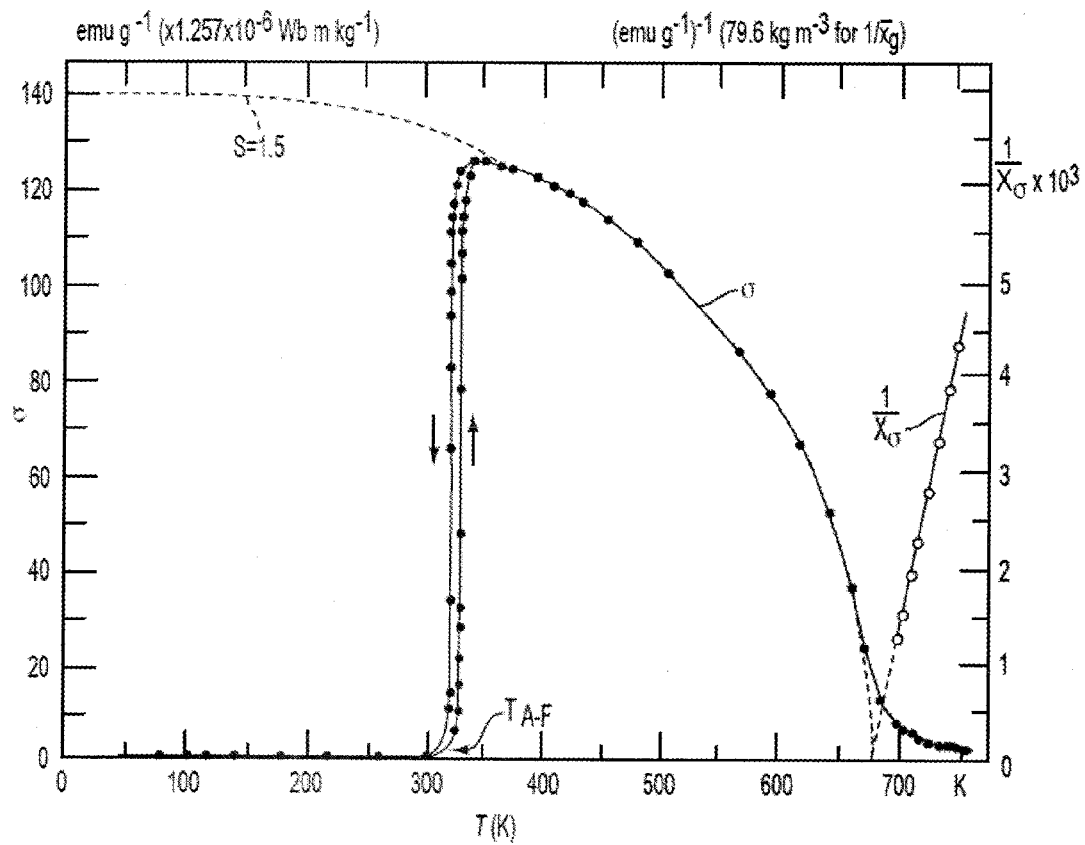
FIG. 3 is a plot of the magnetization curve as a function of temperature for FeRh.

The phase transition interlayer 14 is between the storage layer 12 and the assist layer 16. The phase transition interlayer 14 may comprise a material with small magnetic grains that switches from antiferromagnetic at ambient to ferromagnetic at or above a transition temperature ($T_{A-F}$) that is greater than ambient. One such material is FeRh, which experiences a first order phase transformation at a transition temperature $T_{A-F}$ that can range from 300° K and 500° K, depending on the film texture and the underlayer used. This is much less than the Curie temperature for FeRh, which is in the range of 673° K to 950° K. Also, such heating (e.g., 300° K to 500° K) typically would have little effect on the perpendicular and in-plane magnetic layers 12, 16. As shown in FIG. 3, the phase below the transition temperature $T_{A-F}$ is antiferromagnetic while above the transition temperature the material becomes ferromagnetic. The sharp transition between antiferromagnetic phase and ferromagnetic phase, as shown in the example of FIG. 3, effectively enhances the spatial gradient and limits the size of the phase transformed spot. Recent experimental study has shown that the antiferromagnetic to ferromagnetic phase transformation occurs well within the deep sub-nanosecond regime. The phase transition interlayer 14 may have a thickness of between 1 nm and 10 nm, for example.

Figure 4:
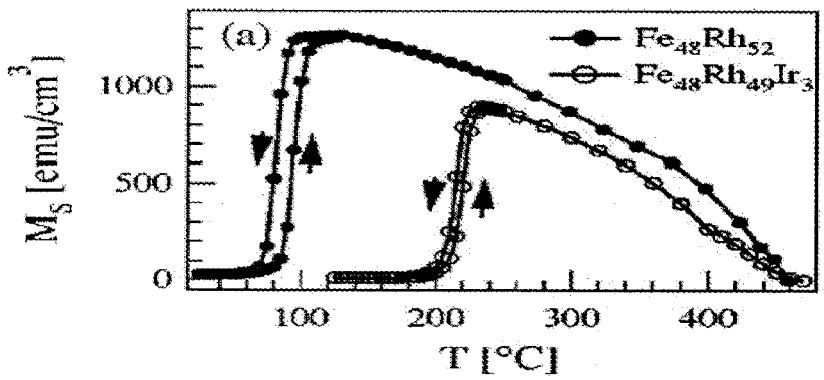
FIG. 4 is a chart showing the magnetization curves for FeRh and FeRhIr as a function of temperature.

In another embodiment, the phase transition interlayer 14 may comprise $Fe_x(Rd_{100-y}M_y)_{100-x}$, where M is selected from the group consisting of Ir, Pt, Ru, Re, and Os. In addition, y is preferably between zero and fifteen inclusive (i.e., $0 \leq y \leq 15$). Addition of the third element M may allow the transition temperature to be tuned (e.g., increased). FIG. 4 shows how the transition temperature can be increased by adding 3% Ir. Other possible materials for the phase transition interlayer 14 include MnZn, SmZn, GdZn, TbZn, DyZn, HoZn, and ErZn.

The magnetic grains in all three layers 12, 14, 16, due to the nature of the film growth may be aligned in the direction perpendicular (the z-direction with reference to the Cartesian coordinates shown in FIG. 1) to the film (which is in the x-y plane in this example). Also, the grain boundaries are preferably near or completely non-magnetic to decouple the (lateral) ferromagnetic exchange coupling among grains in the same layer.

According to various embodiments, when the interlayer 14 is in antiferromagnetic phase (or non-magnetic phase), there exists little magnetic coupling between the two adjacent ferromagnetic layers 12, 16. When the interlayer 14 changes to ferromagnetic phase (i.e., when it is heated to or above the transition temperature $T_{A-F}$), the interlayer 14 couples the magnetic moments of the two adjacent layers 12, 16 ferromagnetically. The exchange coupling between the phase transition interlayer 14 and the in-plane magnetic layer 16 causes the in-plane magnetic layer 16 to exert an effective magnetic field that is significantly stronger (such as 100 times stronger) that fields that can be applied artificially (e.g., externally applied). As a result, an in contrast to prior art magnetic recording media such as disclosed in the Fullerton patent mentioned above, if the anisotropy field-thickness product of the two layers 12, 16 is similar and the coupling is sufficiently strong, the effective magnetic anisotropy of the storage layer 12 and the assist layer 16 essentially vanishes. Hence, writing of the storage layer 12 can be easily achieved with a field that needs only to be a few percent of the ambient anisotropy field of the storage layer 12.

Figure 5:
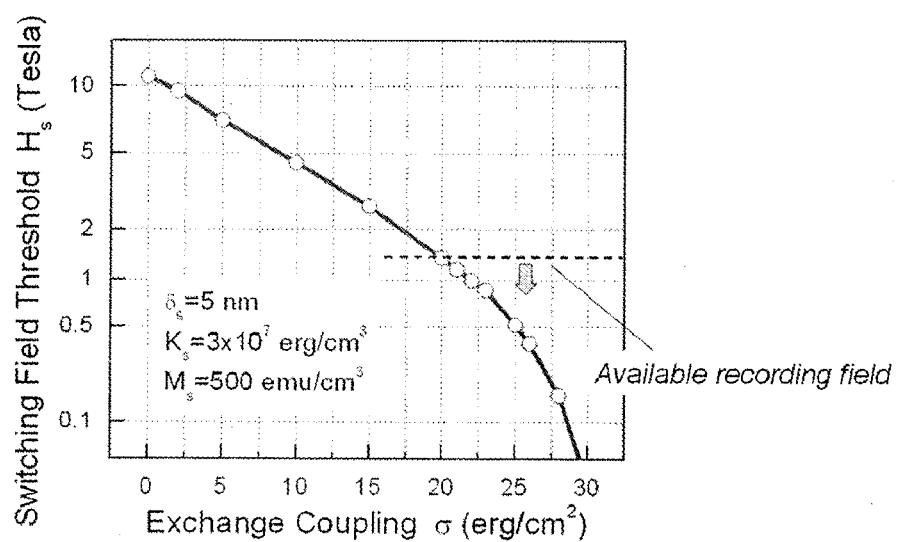
FIG. 5 is a plot of the calculated switching field of a single domain grain in the storage layer as a function of the interlayer exchange coupling strength for an exemplary binary anisotropy media embodiment.

The exchange coupling strength for the interlayer 14 in the ferromagnetic phase can be tuned by changing the interlayer thickness since the coupling energy density per unit film surface area is:

$$\sigma \approx \frac{2A_F}{\delta}$$

where $A_F$ is the exchange stiffness constant of the interlayer 14 in the ferromagnetic phase, which can be estimated via its Curie temperature, and $\delta$ is the interlayer thickness. FIG. 5 shows the calculated switching field for a storage layer 12 whose anisotropy field is $H_k$=200 kOe at ambient. At $\sigma$=1.5 erg/cm$^2$, the switching field of the storage layer 12 becomes around 6 kOe due to the coupling with the magnetic moment of the assist layer 16. Such interlayer exchange coupling can be reached with a FeRh interlayer of a thickness 10 nm or less. Note in the calculation results presented in FIG. 5, the saturation magnetization of the assist layer 16 is chosen to be significantly smaller than that of the storage layer 12 to prevent the irreversible magnetization switching in the assist layer 16. If the corresponding grains of the storage layer 12 and the assist layer 16 have the exact same volume, saturation magnetization, and anisotropy energy constant, the magnetic moments of the two grains rotate coherently during the reversal. Similar reduction of the switching field of the storage layer 12 under a perpendicular external field as a function of the exchange coupling strength is obtained.

Figure 6:
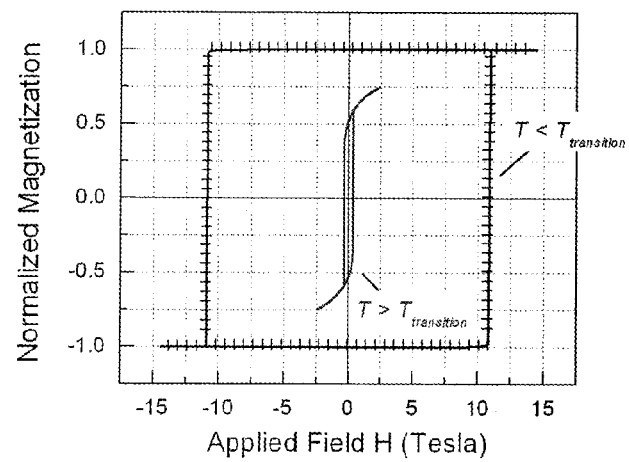
FIG. 6 is a plot of the calculated hysteresis loops for the storage layer for the structure of the example of FIG. 5 with a perpendicularly oriented external magnetic field.

FIG. 6 shows the calculated magnetic hysteresis loops of the storage layer 12 for the structure in FIG. 5 with a perpendicularly oriented external magnetic field. The outer, hatched loop shows the calculated hysteresis loop where the temperature of the interlayer 14 is below the transition temperature $T_{A-F}$. The inner, solid loop shows the calculated hysteresis loop where the temperature of the interlay 14 is above the transition temperature $T_{A-F}$. The planar demagnetization field is neglected here to show the intrinsic switching of a grain in the storage layer 12. The interlayer coupling between the storage layer 12 and the assist layer 16, mediated by the interlayer 14 while in ferromagnetic phase, significantly reduces the switching field and produces a robust switching, as shown in the example of FIG. 6.

FIGS. 7(a)-(c) illustrate the magnetic structure 10 at various temperatures. FIG. 7(a) shows the structure 10 when the temperature of the interlayer 14 is below the transition temperature. FIGS. 7(a)-(c) also show the magnetic moments of the phase transition interlayer 14. In this temperature range, the interlayer 14 is antiferromagnetic and there is little coupling between the storage layer 12 and the assist layer 16. FIG. 7(b) shows the structure 10 after it has been heated to or above the transition temperature $T_{A-F}$. The structure 10 may be heated using a laser, for example. As shown in FIG. 7(b), when the temperature of the interlayer 14 is above the transition temperature $T_{A-F}$ (but below the Curie temperature), the interlayer 14 is ferromagnetic, resulting in ferromagnetic exchange coupling between the storage layer 12 and the assist layer 16, substantially reducing the switching field of the storage layer 12. As such, as shown in FIG. 7(c), a magnetic field H at conventional strength can cause the magnetization of the storage layer 12 to reverse its direction. The heat may then be removed and the interlayer 14 may cool to a temperature below the transition temperature $T_{A-F}$, with the magnetization of the storage layer 12 remaining in its reversed state. In this way, the structure 10 can be used for recording binary data.

Figure 8A:
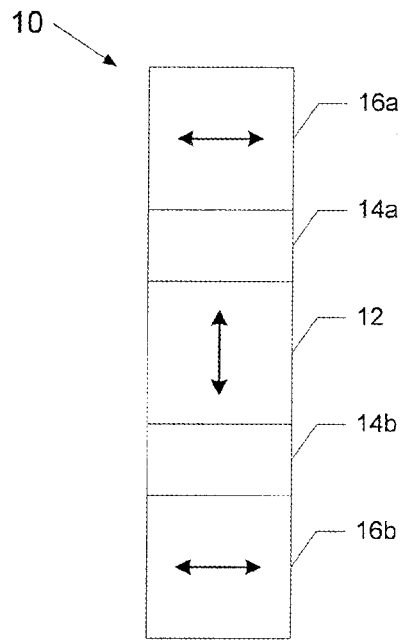
Figure 8B:
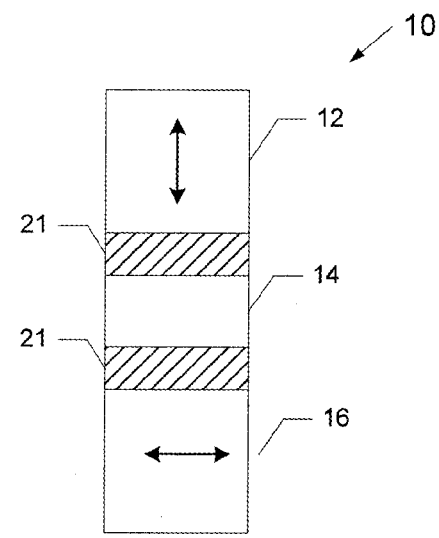

FIGS. 8(a)-(b) show the magnetic structure 10 according to other embodiments of the present invention. In the embodiment of FIG. 8(a), there are two assist layers 16a-b and two interlayers 14a-b. One interlayer 14a is between the upper assist layer 16a and the upper surface of the storage layer 12. The other interlayer 14b is between the lower assist layer 16b and the lower surface of the storage layer 12. In such an embodiment, the interlayer exchange coupling strength is effectively doubled.

In the embodiment of FIG. 8(b), the magnetic structure includes magnetic interlayers 21 between the interlayer 14 and the respective magnetic layers 12, 16. The magnetic interlayers 21 may be used to enhance the magnetic coupling between the interlayer 14 and the magnetic layers 12, 16. The interlayers 21 are preferably relatively thin, such as on the order of one to ten nm in thickness.

As shown in FIG. 9, the BAM layer 10 may be formed on a soft magnetic underlayer (SUL) 20. The SUL 20 may (1) enhance the perpendicular magnetic field for switching the magnetization of the storage layer 12 and/or (2) shunt the magnetic flux generated by the assist layer 16 and enhance the magnetic flux generated by the storage layer 12. Also as shown in FIG. 9, the BAM layer 10 may be formed on a seed layer 22. The seed layer 22 may be used to enhance the growth of the layers of the BAM layer 10. The various layers may be sequentially formed on a substrate (not shown) using conventional thin film deposition techniques. The seed underlayer 22 may comprise Ruthenium or MgO, for example. The SUL 20 may comprise, for example, FeSiCo, cobalt-zirconium-tantalum (CZT), or Co-alloy/Ru/Co-alloy.

For a magnetic recording medium using the magnetic structure 10, the substantial reduction of the switching field of the storage layer grains with the interlayer exchange coupling, occurring when the interlayer 14 is heated to its ferromagnetic phase, enables the recording in a storage media with extremely high anisotropy field. Therefore, the size of the grains can be drastically reduced while still maintaining sufficient thermal magnetic stability. FIG. 10 shows a calculated grain size for the grains in the storage layer 12 as a function of the anisotropy energy constant according to an embodiment of the present invention. A thickness of 15 nm is assumed for the storage layer 12 and a constraint of an energy barrier of 60 $k_B T$ at room temperature is imposed. The grain size reduction may directly translate to an area density increase, as shown in FIG. 11. With the proposed medium microstructure, recording can be achieved at moderately elevated temperatures, around 150° C. to 250° C., with robust recording, significantly alleviating many thermal management issues presented with Curie temperature writing. Both the phase transition of the interlayer 14 and the magnetic switching of the storage layer 12 can occur within a small fraction of a nanosecond.

The proposed medium could be used with HAMR in hard disk drives. Since the transition temperature can be tuned by adding certain elements, such as Ir, the phase transition of the interlayer 14 could be engineered so that the anisotropy switching occurs at a desired temperature. As such, as shown in FIG. 12, a write head 30 having a heating element 32 could be used to write data to a magnetic recording medium 34 comprised of the binary anisotropy media 10 described above. The heating element 32 may be a resistive heating element or it could be a laser, for example. Magnetic shields (or poles) 36 may be positioned on each side of the heating element 32. The shields 36 may be fabricated, for example, from a soft magnetic material such as, for example, nickel-iron (NiFe). The write head 30 may also include an inductive write element (not shown) for writing data to the medium 34. The write head 30 may be part of a read/write head that also comprises a read sensor (such as a GMR sensor) for sensing data recorded on the medium. FIG. 13 is a top plan view of the recording medium 34.

FIG. 14 is a diagram of a write head 30 according to another embodiment of the present invention. In the illustrated embodiment, the write head 30 comprises a leading shield 40, an inductive write element 42 and a trailing shield 44. The inductive write element 42 may comprise a number of windings 46 around a magnetic core 48.

As shown in FIG. 14, the write head 30 may also include a heating element 41 and a conductor 43 between the write element 42 and the trailing shield 44. The heating element 41 may be made from a material that conducts electricity but that also has a relatively high electrical resistivity, such as Tungsten. The conductor 43 may be made from an electrical conductor with a low resistivity, such as Cu or Ag. The write head 30 may also include an insulator 45 insulating the trailing shield 44. That way, current, supplied from a current source 47, can flow through the trailing shield 44 and the conductor 43 to the heating element 41 to thereby cause the heating element 41 to heat the BAM layer in the recording medium 34.

The binary anisotropy media 10 may also be used as part of a magnetic storage layer for a magnetic memory element in a magnetic memory device (e.g., a MRAM). FIG. 15 is a side view of a magnetic memory element 50 according to one such embodiment. As shown in the illustrated embodiment, the storage layer for the magnetic memory element 50 comprises a BAM layer 10, including the storage layer 12, the phase transition interlayer 14, and the magnetic assist layer 16. The memory element 50 also comprises a reference layer 52 and a middle layer 54 that is between the BAM layer 10 and the reference layer 52. The reference layer 52 may include a magnetic material such as, for example, a multi-layer structure of Co/Pt, Co/Pd, or Co/Ni.

The middle layer 54 may comprise (i) an upper spin polarization layer 56 next to the storage layer 12, (ii) a lower spin polarization layer 58, and (iii) an interlayer 60 between the upper and lower spin polarization layers. The spin polarization layers 56, 58 may comprise CoFe, CoFeB, or Co, for example. In various embodiments, the interlayer 60 acts as barrier layer of a magnetic tunnel junction (MTJ) structure. In such embodiments, the interlayer 60 may comprise an insulative material, such as $Al_2O_3$, $TiO_x$, or MgO, for example. In other embodiments, the interlayer 60 may provide a magnetoresistive structure, in which case the interlayer 60 may comprise an electrically conductive material, such as Cu, for example.

As shown in FIG. 15, the magnetic memory element 50 may also comprise upper and lower electrical contact layers 62, 64 to thereby provide electrodes for the magnetic memory element 50. The electrical contact layers 62, 64 may comprise an electrically conductive material such as Cu, for example.

FIG. 16 is a diagram of a memory cell 70 according to one embodiment of the present invention. In the illustrated embodiment, the magnetic memory element 50 is connected to a switch 70 (e.g., a FET). A write line 72 injects current into the magnetic memory element 50 when the switch 70 is conductive. Heat from the current through the magnetic memory element 50 can be used to heat the interlayer 14 to or above the transition temperature.

FIG. 17 is a diagram of a memory cell 80 according to another embodiment of the present invention and FIG. 18 is a diagram of an array 82 of such memory cells 80. The illustrated embodiment utilizes two sets of current lines. A first write line 84, when activated, selects a row of the memory cells 80. The second set of write lines 86 are adjacent to the memory elements 50 and, when activated, carry current in the opposite direction to maximize the field strength of the addressed memory element 50 while minimizing the field on the half-select elements in the same row.

As shown in FIGS. 17 and 18, the first write line 84 may comprise a heating element 88 for each memory element 50. The heating element 88 may be comprised of an electrically conductive material with a relatively high electrical resistance, such as Tungsten. When a particular memory element is selected and its corresponding write line 84 is activated, the current in the write line 84 may cause the heating element 88 to heat the interlayer 14 of the BAM layer 10 of the memory element 50, as described above. As shown in FIG. 18, each memory element 50 of the array 80 may have an associated heating element 88.

The recording media 34 described above, including the BAM layer 10, may be used in a magnetic disk drive system, for example. FIG. 19 shows an exemplary head disk assembly (HDA) 100 according to such an embodiment. The HDA 100 includes a spindle 132 that supports and rotates a magnetic disk 134 having the BAM layer 10 described above. The spindle 132 may be rotated by a motor (not shown) that is controlled by a motor controller (not shown). A read/write head 140 may be mounted on an air-bearing slider 142 that is supported by a suspension 144 and an actuator arm 146. The disk drive system 100 may include a number of such disks, sliders and suspensions in some embodiments, such as for a large capacity direct access storage device (DASD). The suspension 144 and the actuator arm 146 position the slider 142 so that the read/write head 140 may be in a transducing relationship with the surface of the disk 134. The disk 134 may have numerous sectors 149 and tracks 148.

FIG. 20 is a diagram of a computing device 200 according to various embodiments of the present invention. The computing device 200 includes a processor 202 in communication with a cache memory 204 through a bus 206. The cache memory 204 is in communication with a memory device 208 through a bus 210. The memory device 208 may be a magnetic memory device (e.g., MRAM) having an array of memory cells with a BAM layer, such as the type described above in connection with FIGS. 17 and 18. The cache memory 204 may be in communication with an I/O adapter 212 via a local bus 214. The computing device 200 may also have a disk drive system 216 in communication with the local bus 214 via the I/O adapter 212. The disk drive system 216 may comprise a disk controller 218 and a HDA 100 having a recording medium with a BAM layer, such as described above in connection with FIG. 19. The computing device 200 may be, for example, a personal computer (PC), a workstation, a laptop computer, a server, a supercomputer, a personal digital assistant (PDA), a pocket-PC, etc. Other, well-known components of a typical computing device, such as the monitor, video processors and memory, other peripheral devices, etc., are not shown in FIG. 20 for the sake of convenience.

In another general embodiment, the present invention is directed to methods of manufacturing the binary anisotropy media. In one embodiment, the process may comprise (i) forming the magnetic assist layer 16 on a substrate; (ii) forming the phase transition interlayer 14 on the magnetic assist layer 16; and (iii) forming the magnetic storage layer 12 on the phase transition interlayer 14. The various layers 12, 14, 16 may be formed using conventional thin film deposition techniques. The substrate may comprise the soft magnetic underlayer 20 according to various embodiments. Also, as described above in connection with FIG. 9, the magnetic assist layer 16 may be formed on the seed layer 22, such that the magnetic assist layer 16 is formed indirectly on the substrate. In another embodiment, the storage layer 12 may be on the bottom of the BAM 10 such that the storage layer 12 is formed on the substrate (and/or the seed layer 22, if one is used).

In another general embodiment, the present invention is directed to methods of writing binary data to the BAM 10. According to various embodiments, the process may comprise heating the BAM layer 10 from ambient to or above the transition temperature $T_{A-F}$ of the interlayer 14. Then, while the interlayer 14 is ferromagnetic since it is at or above the transition temperature $T_{A-F}$, reversing the orientation of the magnetization of the storage layer 12 with a magnetic write field. As mentioned above, the required write field at the recording temperature (a temperature at or above the transition temperature) needs only to be a small percentage of the ambient anisotropy field of the storage layer 12. The BAM layer 10 may be heated using, for example, a laser or a heating element that emits heat when conducting electrical current.

Although the present invention has been described herein in connection with certain disclosed embodiments, many modifications and variations to those embodiments may be implemented. For example, different types of end effectors may be employed. Also, where materials are disclosed for certain components, other materials may be used. The foregoing description and following claims are intended to cover all such modification and variations.

What is claimed is:

1. A magnetic structure comprising:
    a magnetic storage layer having a magnetic easy axis perpendicular to a film plane of the magnetic layer;
    a magnetic assist layer having a magnetic easy axis in the film plane, wherein the magnetic assist layer has a thickness of 5 nm to 20 nm; and
    a temperature-dependent, exchange-coupling, phase transition interlayer between the magnetic storage layer and the magnetic assist layer, wherein the phase transition interlayer comprises $Fe_xRh_y$, wherein x+y=97 to 100 and y=49 to 52, which exhibits a first order phase transformation from an antiferromagnetic phase to a ferromagnetic phase at a transition temperature that is greater than ambient upon heating of the phase transition interlayer to the transition temperature, and wherein the phase transition interlayer magnetically exchange couples magnetic moments of the magnetic storage layer and the magnetic assist layer when the phase transition interlayer is in the ferromagnetic phase, and wherein the exchange coupling of the magnetic storage layer and the magnetic assist layer by the phase transition interlayer is greater when the phase transition interlayer is in the ferromagnetic phase than when in the antiferromagnetic phase, wherein the magnetic structure has a characteristic that a strength of an external magnetic field required to reverse the magnetic easy axis of the magnetic storage layer is less when the phase transition interlayer is in the ferromagnetic phase than when the phase transition interlayer is in the antiferromagnetic phase.

2. The magnetic structure of claim 1, wherein the phase transition interlayer comprises $Fe_x(Rh_{100-y}M_y)_{100-x}$, where M is selected from the group consisting of Ir, Pt, Ru, Re, and Os.

3. The magnetic structure of claim 1, wherein the transition temperature is between 300° K. and 500° K.

4. The magnetic structure of claim 1, wherein the phase transition interlayer has a thickness of 1 nm to 10 nm.

5. The magnetic structure of claim 1, further comprising:
a first magnetic interlayer between the magnetic storage layer and the phase transition interlayer; and
a second magnetic interlayer between the magnetic assist layer and the phase transition interlayer.

6. A magnetic structure comprising:
a magnetic storage layer having a magnetic easy axis perpendicular to a film plane of the magnetic storage layer;
a first magnetic assist layer having a magnetic easy axis in the film plane, wherein the first magnetic assist layer has a thickness of 5 nm to 20 nm;
a first temperature-dependent, exchange coupling, phase transition interlayer between an upper surface of the magnetic storage layer and the first magnetic assist layer;
a second magnetic assist layer having a magnetic easy axis in the film plane; and
a second temperature-dependent, exchange-coupling, phase transition interlayer between a lower surface of the magnetic storage layer and the second magnetic assist layer, wherein the first and second phase transition interlayers each comprise $Fe_xRh_y$, wherein x+y=97 to 100 and y=49 to 52, which exhibits a first order phase transformation from an antiferromagnetic phase to an ferromagnetic phase at a transition temperature that is greater than ambient upon heating of the first and second phase transition interlayers to the transition temperature, wherein the first and second phase transition interlayers magnetically exchange couple magnetic moments of the magnetic storage layer and the first and second magnetic assist layers when the first and second phase transition interlayers are in the ferromagnetic phase, and wherein the exchange coupling of the magnetic storage layer and the first and second magnetic assist layers by the first and second phase transition interlayers is greater when the first and second phase transition interlayer are in the ferromagnetic phase than when the first and second phase transition interlayers are in the antiferromagnetic phase, wherein the magnetic structure has a characteristic that a strength of an external magnetic field required to reverse the magnetic easy axis of the magnetic storage layer is less when the first and second phase transition interlayers are in the ferromagnetic phase than when the first and second phase transition interlayers are in the antiferromagnetic phase.

7. The magnetic structure of claim 6 wherein the first and second phase transition interlayers comprise $Fe_x(Rh_{100-y}M_y)_{100-x}$, where M is selected from the group consisting of Ir, Pt, Ru, Re, and Os.

8. A magnetic recording medium comprising a plurality of magnetic structures, wherein each magnetic structure comprises:
a magnetic storage layer having a magnetic easy axis perpendicular to a film plane of the magnetic storage layer;
a magnetic assist layer having a magnetic easy axis in the film plane, wherein the magnetic assist layer has a thickness of 5 nm to 20 nm; and
a temperature-dependent, exchange-coupling, phase transition interlayer between the magnetic storage layer and the magnetic assist layer, wherein the phase transition interlayer comprises $Fe_xRh_y$, wherein x+y=97 to 100 and y=49 to 52, which exhibits a first order phase transformation from an antiferromagnetic phase to a ferromagnetic phase at a transition temperature that is greater than ambient upon heating of the phase transition interlayer to the transition temperature, and wherein the phase transitions interlayer magnetically exchange couples magnetic moments of the magnetic storage layer and the magnetic assist layer when the phase transition interlayer is in the ferromagnetic phase, and wherein the exchange coupling of the magnetic storage layer and the magnetic assist layer by the phase transition interlayer is greater when the phase transition interlayer is in the ferromagnetic phase than when in the antiferromagnetic phase, wherein the magnetic structure has a characteristic that a strength of an external magnetic field required to reverse the magnetic easy axis of the magnetic storage layer is less when the phase transition interlayer is in the ferromagnetic phase than when the phase transition interlayer is in the antiferromagnetic phase.

9. The magnetic recording medium of claim 8 further comprising a soft magnetic underlayer under the magnetic structures.

10. The magnetic recording medium of claim 9 further comprising a seed layer between the soft magnetic underlayer and the magnetic structures.

11. The magnetic recording medium of claim 9 wherein the phase transition interlayer comprises $Fe_x(Rh_{100-y}M_y)_{100-x}$, where M is selected from the group consisting of Ir, Pt, Ru, Re, and Os.

12. The magnetic recording medium of claim 8 further comprising:
a first magnetic interlayer between the magnetic storage layer and the phase transition interlayer; and
a second magnetic interlayer between the magnetic assist layer and the phase transition interlayer.

13. A magnetic memory element comprising:
a magnetic data storage layer comprising:
a perpendicular anisotropy magnetic storage layer having a magnetic easy axis perpendicular to a film plane of the perpendicular anisotropy magnetic storage layer;
an in-plane magnetic assist layer having a magnetic easy axis in the film plane, wherein the in-plane magnetic assist layer has a thickness of 5 nm to 20 nm; and
a temperature-dependent, exchange-coupling, phase transition interlayer between the perpendicular anisotropy magnetic storage layer and the magnetic assist layer, wherein the phase transition interlayer comprises $Fe_xRh_y$, wherein x+y=97 to 100 and y=49 to 52, which exhibits a first order phase transformation from an antiferromagnetic phase to a ferromagnetic phase at a transition temperature that is greater than ambient upon heating of the phase transition interlayer to the transition temperature, and wherein the phase transition interlayer magnetically exchange couples magnetic moments of the perpendicular anisotropy magnetic storage layer and the magnetic assist layer when the phase transition interlayer is in ferromagnetic state, and wherein the exchange coupling of the perpendicular anisotropy magnetic storage layer and the magnetic assist layer by the phase transition interlayer is greater when the phase transition interlayer is in the ferromagnetic phase than when in the antiferromagnetic state, wherein the magnetic data storage layer has a characteristics that a strength of an external magnetic field required to reverse the magnetic easy axis of the perpendicular anisotropy magnetic storage layer is less when the phase transition interlayer is in the ferromagnetic phase than when the phase transition interlayer is in the antiferromagnetic phase.

14. The magnetic memory element of claim 13, further comprising:
a magnetic reference layer; and
a middle layer between the magnetic data storage layer and the magnetic reference layer.

15. The magnetic memory element of claim 14, wherein the middle layer comprises:
an upper spin polarization layer;
a lower spin polarization layer; and
an interlayer between the upper and lower spin polarization layers.

16. The magnetic memory element of claim 15, wherein the phase transition interlayer comprises $Fe_x(Rh_{100-y}M_y)_{100-x}$, where M is selected from the group consisting of Ir, Pt, Ru, Re, and Os.

17. The magnetic memory element of claim 15, wherein the transition temperature is between 300° K. and 500° K.

18. A memory device comprising an array of magnetic memory cells, wherein each magnetic memory cell comprises:
a magnetic memory element comprising:
a magnetic data storage layer comprising:
a perpendicular anisotropy magnetic storage layer having a magnetic easy axis perpendicular to a film plane of the perpendicular anisotropy magnetic storage layer;
an in-plane magnetic assist layer having a magnetic easy axis in the film plane, wherein the in-plane magnetic assist layer has a thickness of 5 nm to 20 nm; and
a temperature-dependent, exchange-coupling, phase transition interlayer between the perpendicular anisotropy magnetic storage layer and the magnetic assist layer, wherein the phase transition interlayer comprises $Fe_xRh_y$, wherein x+y=97 to 100 and y=49 to 52, which exhibits a first order phase transformation from an antiferromagnetic phase to a ferromagnetic phase at a transition temperature that is greater than ambient upon heating of the phase transition interlayer to the transition temperature, wherein the phase transition interlayer magnetically exchange couples magnetic moments of the perpendicular anisotropy magnetic storage layer and the magnetic assist layer when the phase transition interlayer is in ferromagnetic state and wherein the exchange coupling of the perpendicular anisotropy magnetic storage layer and the magnetic assist layer by the phase transition interlayer is greater when the phase transition interlayer is in the ferromagnetic phase than when the phase transition interlayer is in the antiferromagnetic state, wherein the magnetic data storage layer has a characteristics that a strength of an external magnetic field required to reverse the magnetic easy axis of the perpendicular anisotropy magnetic storage layer is less when the phase transition interlayer is in the ferromagnetic phase than when the phase transition interlayer is in the antiferromagnetic phase;
a magnetic reference layer; and
a middle layer between the magnetic data storage layer and the magnetic reference layer;
a switch connected to the magnetic memory element; and
a write line connected to the magnetic memory element, wherein the write line comprises a heating element proximate to the magnetic memory element for heating, upon activation of the write line, the phase transition interlayer to the transition temperature.

19. The memory device of claim 18, wherein the phase transition interlayer comprises FeRh.

20. The memory device of claim 18, wherein the phase transition interlayer comprises $Fe_x(Rh_{100-y}M_y)_{100-x}$, where M is selected from the group consisting of Ir, Pt, Ru, Re, and Os.

21. The memory device of claim 18, wherein the transition temperature is between 300° K. and 500° K.

22. A computing device comprising:
a processor; and
a memory device in communication with the processor, wherein the memory device comprises an array of magnetic memory cells, wherein each magnetic memory cell comprises:
a magnetic memory element comprising:
a magnetic data storage layer comprising:
a perpendicular anisotropy magnetic storage layer having a magnetic easy axis perpendicular to a film plane of the perpendicular anisotropy magnetic storage layer;
an in-plane magnetic assist layer having a magnetic easy axis in the film plane, wherein the in-plane magnetic assist layer has a thickness of 5 nm to 20 nm; and
a temperature-dependent, exchange-coupling, phase transition interlayer between the perpendicular anisotropy magnetic storage layer and the magnetic assist layer, wherein the phase transition interlayer comprises $Fe_xRh_y$, wherein x+y=97 to 100 and y=49 to 52, which exhibits a first order phase transformation from an antiferromagnetic phase to a ferromagnetic phase at a transition temperature that is greater than ambient upon heating of the phase transition interlayer to the transition temperature, wherein the phase transition interlayer magnetically exchange couples magnetic moments of the perpendicular anisotropy magnetic storage layer and the magnetic assist layer when the phase transition interlayer is in ferromagnetic state and wherein the exchange coupling of the perpendicular anisotropy magnetic storage layer and the magnetic assist layer by the phase transition interlayer is greater when the phase transition interlayer is in the ferromagnetic phase than when the phase transition interlayer is in the antiferromagnetic state, wherein the magnetic data storage layer has a characteristics that a strength of an external magnetic field required to reverse the magnetic easy axis of the perpendicular anisotropy magnetic storage layer is less when the phase transition interlayer is in the ferromagnetic phase than when the phase transition interlayer is in the antiferromagnetic phase;

a magnetic reference layer; and a middle layer between the magnetic data storage layer and the magnetic reference layer;

a switch connected to the magnetic memory element; and a write line connected to the magnetic memory element, wherein the write line comprises a heating element proximate to the magnetic memory element for heating, upon activation of the write line, the phase transition interlayer to the transition temperature.

23. The computing device of claim 22, wherein the phase transition interlayer comprises FeRh.

24. The computing device of claim 22, wherein the phase transition interlayer comprises $Fe_x(Rh_{100-y}M_y)_{100-x}$, where M is selected from the group consisting of Ir, Pt, Ru, Re, and Os.

25. The computing device of claim 22, wherein the transition temperature is between 300° K. and 500° K.

26. A head disk assembly comprising:

a magnetic disk, the magnetic disk comprising a magnetic recording medium, wherein the magnetic recording medium comprises a plurality of magnetic structures, wherein each magnetic structure comprises:

a magnetic storage layer having a magnetic easy axis perpendicular to a film plane of the magnetic storage layer;

a magnetic assist layer having a magnetic easy axis in the film plane, wherein the magnetic assist layer has a thickness of 5 nm to 20 nm; and a temperature-dependent, exchange-coupling, phase transition interlayer between the magnetic storage layer and the magnetic assist layer, wherein the phase transition interlayer comprises FexRhy, wherein x+y=97 to 100 and y=49 to 52, which exhibits a first order phase transformation from an antiferromagnetic phase to a ferromagnetic phase at a transition temperature that is greater than ambient upon heating of the phase transition interlayer to the transition temperature, and wherein the phase transition interlayer magnetically exchange couples magnetic moments of the magnetic storage layer and the magnetic assist layer when the phase transition interlayer is in the ferromagnetic phase, and wherein the exchange coupling of the magnetic storage layer and the magnetic assist layer by the phase transition interlayer is greater when the phase transition interlayer is in the ferromagnetic phase than when in the antiferromagnetic phase, and wherein each magnetic structure has a characteristic that a strength of an external magnetic field required to reverse the magnetic easy axis of the magnetic storage layer is less when the phase transition interlayer is in the ferromagnetic phase than when the phase transition interlayer is in the antiferromagnetic phase; and a read/write head proximate the magnetic disk, wherein the read/write head comprises a heating element for heating the temperature-dependent, exchange-coupling, phase transition interlayer from antiferromagnetic to ferromagnetic, wherein the phase transition interlayer, upon being heated to ferromagnetic, magnetically exchange couples magnetic moments of the magnetic storage layer and the magnetic assist layer.

27. The head disk assembly of claim 26, wherein the phase transition interlayer comprises $Fe_x(Rh_{100-y}M_y)_{100-x}$, where M is selected from the group consisting of Ir, Pt, Ru, Re, and Os.

28. The head disk assembly of claim 26, wherein the transition temperature is between 300° K. and 500° K.

29. A method of manufacturing a magnetic microstructure comprising:

forming a magnetic assist layer on a substrate, the magnetic assist layer having a magnetic easy axis in a film plane of the magnetic assist layer, and wherein the magnetic assist layer has a thickness of 5 nm to 20 nm;

forming a temperature-dependent, exchange-coupling, phase transition interlayer on the magnetic assist layer, wherein the phase transition interlayer comprises $Fe_x$-$Rh_y$, wherein x+y=97 to 100 and y=49 to 52, which exhibits a first order phase transformation from an antiferromagnetic phase to a ferromagnetic phase at a transition temperature that is greater than ambient upon heating the phase transition to the transition temperature; and forming a magnetic storage layer on the phase transition interlayer, the magnetic storage layer having a magnetic easy axis perpendicular to the film plane, wherein the phase transition interlayer magnetically exchange couples magnetic moments of the magnetic storage layer and the magnetic assist layer when the phase transition interlayer is in the ferromagnetic phase, and wherein the exchange coupling of the magnetic storage layer and the magnetic assist layer by the phase transition interlayer is greater when the phase transition interlayer is in the ferromagnetic phase than when in the antiferromagnetic phase, wherein the magnetic structure has a characteristic that a strength of an external magnetic field required to reverse the magnetic easy axis of the magnetic storage layer is less when the phase transition interlayer is in the ferromagnetic phase than when the phase transition interlayer is in the antiferromagnetic phase.

30. The method of claim 29, wherein the phase transition interlayer comprises $Fe_x(Rh_{100-y}M_y)_{100-x}$, where M is selected from the group consisting of Ir, Pt, Ru, Re, and Os.

31. The method of claim 29, wherein the transition temperature is between 300° K. and 500° K.

32. The method of claim 29, wherein the substrate comprises a soft magnetic underlayer.

33. The method of claim 32, further comprising forming a seed layer on the soft magnetic underlayer, and wherein forming the magnetic assist layer on the substrate comprises forming the magnetic assist layer on the seed layer.

34. A method of manufacturing a magnetic microstructure comprising:

forming a magnetic storage layer on a substrate, the magnetic storage layer having a magnetic easy axis perpendicular to a film plane of the magnetic storage layer;

forming a temperature-dependent, exchange-coupling, phase transition interlayer on the magnetic storage layer, wherein the phase transition interlayer comprises $Fe_x$-$Rh_y$, wherein x+y=97 to 100 and y=49 to 52, which exhibits a first order phase transformation from an antiferromagnetic phase to a ferromagnetic phase at a transition temperature that is greater than ambient upon heating the phase transition to the transition temperature; and forming a magnetic assist layer with a thickness of 5 nm to 20 nm on the phase transition interlayer, the magnetic assist layer having a magnetic easy axis in the film plane, wherein the phase transition interlayer magnetically exchange couples magnetic moments of the magnetic storage layer and the magnetic assist layer when the phase transition interlayer is in the ferromagnetic phase, and wherein the exchange coupling of the magnetic storage layer and the magnetic assist layer by the phase transition interlayer is greater when the phase transition interlayer is in the ferromagnetic phase than when in the antiferromagnetic phase, wherein the magnetic structure has a characteristic that a strength of an external magnetic field required to reverse the magnetic easy axis of the magnetic storage layer is less when the phase transition interlayer is in the ferromagnetic phase than when the phase transition interlayer is in the antiferromagnetic phase.

35. The method of claim 34, wherein the phase transition interlayer comprises $Fe_x(Rh_{100-y}M_y)_{100-x}$, where M is selected from the group consisting of Ir, Pt, Ru, Re, and Os.

36. The method of claim 34, wherein the transition temperature is between 300° K. and 500° K.

37. The method of claim 34, wherein the substrate comprises a soft magnetic underlayer.

38. The method of claim 37, further comprising forming a seed layer on the soft magnetic underlayer, and wherein forming the magnetic storage layer on the substrate comprises forming the magnetic storage layer on the seed layer.

39. The magnetic structure of claim 4, wherein the thickness of the magnetic storage layer is 5 nm to 20 nm.

40. The magnetic structure of claim 39, wherein the thickness of the phase transition interlayer is 1 nm to 5 nm.

41. The magnetic structure of claim 1, wherein the magnetic storage layer and the magnetic assist layer have similar anisotropy field-thickness products such that when the phase transition interlayer is ferromagnetic such that the phase transition interlayer magnetically exchange couples the magnetic moments of the magnetic storage layer and the magnetic assist layer, an effective magnetic anisotropy of the magnetic storage layer and the magnetic assist layer essentially vanishes.

42. The magnetic structure of claim 1, wherein:
magnetic grains of the magnetic storage layer are aligned perpendicular to the film plane;
magnetic grains of the phase transition interlayer are aligned perpendicular to the film plane; and
magnetic grains of the magnetic assist layer are aligned perpendicular to the film plane.

43. The magnetic structure of claim 1, wherein:
the magnetic storage layer comprises a magnetic material selected from the group consisting of Co alloys, FePt ($L1_0$), CoPt, FePd, AlMn;
the phase transition interlayer comprises a temperature-dependent, phase transition material selected from the group consisting of FeRh, MnZn, SmZn, GdZn, TbZn, DyZn, HoZn, ErZn, and $Fe_x(Rh_{100-y}M_y)_{100-x}$, where M is selected from the group consisting of Ir, Pt, Ru, Re, and Os; and
the magnetic assist layer comprises a magnetic material selected from the group consisting of Co alloys, FePt ($L1_0$), CoPt, FePd, AlMn.

44. The magnetic structure of claim 1, further comprising:
a soft magnetic underlayer under the magnetic storage layer; and
a seed layer between the soft magnetic underlayer and the magnetic storage layer.

45. The memory device of claim 18, wherein the FeRh of the phase transition interlayer comprises $Fe_xRh_y$, wherein x+y=97 to 100 and y=49 to 52.

46. The computing device of claim 22, wherein the FeRh of the phase transition interlayer comprises $Fe_xRh_y$, wherein x+y=97 to 100 and y=49 to 52.

* * * * *